US012796290B2

United States Patent

(12) United States Patent
Choi et al.

(10) Patent No.: US 12,796,290 B2
(45) Date of Patent: Nov. 10, 2026

(54) WINDOW AND DISPLAY DEVICE INCLUDING THE SAME

(71) Applicant: SAMSUNG DISPLAY CO., LTD., Yongin-si (KR)

(72) Inventors: Seongsik Choi, Yongin-si (KR); Jaeho Lee, Yongin-si (KR); Chaekyeong Lee, Yongin-si (KR); Sungwoo Kim, Yongin-si (KR); Jaehong Kim, Yongin-si (KR); Won-Jong Baek, Yongin-si (KR); Jongseok Joo, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 402 days.

(21) Appl. No.: 18/481,221

(22) Filed: Oct. 4, 2023

(65) Prior Publication Data

US 2024/0237492 A1 Jul. 11, 2024

(30) Foreign Application Priority Data

Jan. 10, 2023 (KR) ........................ 10-2023-0003686

(51) Int. Cl.
*H10K 59/00* (2023.01)
*H10K 59/80* (2023.01)

(52) U.S. Cl.
CPC ....... *H10K 59/873* (2023.02); *H10K 59/8792* (2023.02)

(58) Field of Classification Search
CPC ...... H10K 59/12; H10K 59/122; H10K 59/87; H10K 59/872; H10K 59/873; H10K 59/8791; H10K 59/8792; B32B 2250/04; B32B 2250/05; B32B 2307/40; B32B 2307/418; B32B 2307/412; B32B 2307/416
See application file for complete search history.

(56) References Cited

U.S. PATENT DOCUMENTS 10,578,777 B2 3/2020 Bellman et al.
10,822,271 B2 11/2020 Abid et al.
(Continued)

FOREIGN PATENT DOCUMENTS

JP 2017-528411 T 9/2017
JP 6843743 B9 3/2021
KR 10-2020-0004369 A 1/2020

*Primary Examiner* — Reema Patel
(74) *Attorney, Agent, or Firm* — F. CHAU & ASSOCIATES, LLC

(57) ABSTRACT

A window includes a base layer, a first layer disposed on the base layer, a second layer disposed on the first layer, a third layer disposed on the second layer, and a fourth layer disposed on the third layer. The second layer includes silicon dioxide ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). The third layer includes iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti).

20 Claims, 6 Drawing Sheets

(56) References Cited

U.S. PATENT DOCUMENTS

| | | | | |
|---|---|---|---|---|
| 2017/0183257 | A1 | 6/2017 | Apitz et al. | |
| 2020/0081162 | A1* | 3/2020 | Park | G02B 1/14 |
| 2021/0238085 | A1 | 8/2021 | Li et al. | |

* cited by examiner

WINDOW AND DISPLAY DEVICE INCLUDING THE SAME

CROSS-REFERENCE TO RELATED APPLICATIONS

This U.S. non-provisional patent application claims priority under 35 U.S.C. § 119 to Korean Patent Application No. 10-2023-0003686, filed on Jan. 10, 2023, the entire contents of which are hereby incorporated by reference.

TECHNICAL FIELD

The present disclosure herein relates to display and, more specifically, to a window and a display device including the same.

DISCUSSION OF THE RELATED ART

A display device is used in various multimedia devices such as a television, a mobile phone, a tablet computer, a game console, and the like, to provide image information to a user. Recently, various types of flexible display devices which are foldable or bendable are being developed. A flexible display device may be changed in various shapes by being folded, rolled, or bent, and thus, electronic devices may incorporate flexible display devices so as to be more convenient to carry.

A flexible display device may include a display panel and a window which are each foldable or bendable. However, the flexible window that is used in conjunction with flexible display devices may be more easily damaged by an external impact.

SUMMARY

A window includes a base layer, a first layer disposed on the base layer, a second layer disposed on the first layer, a third layer disposed on the second layer, and a fourth layer disposed on the third layer. The second layer includes silicon dioxide ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). The third layer includes iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti).

The thickness of the third layer may be about 2 nm to about 10 nm.

At a wavelength of about 550 nm, the refractive index of the second layer may be about 1.3 to about 1.6.

The second layer may include silicon dioxide ($SiO_2$), magnesium oxide (MgO), and/or aluminum oxide ($Al_2O_3$).

The second layer may be disposed directly on the first layer, the third layer may be disposed directly on the second layer, and the fourth layer may be disposed directly on the third layer.

The first layer may include magnesium fluoride ($MgF_2$) and/or magnesium oxide (MgO).

The first layer may further include yttrium oxyfluoride (YOF).

The first layer may include a solid solution in which the magnesium oxide, the magnesium fluoride, and the yttrium oxyfluoride are mixed.

At a wavelength of about 550 nm, reflectance on an upper surface of the fourth layer may be about 6.0% or less.

The fourth layer may include a fluorine-containing polymer.

At a wavelength of about 550 nm, a refractive index of the first layer may be about 1.3 to about 1.5, and at a wavelength of about 550 nm, a refractive index of the fourth layer may be about 1.3 to about 1.5.

The base layer may include a glass substrate or a polymer film.

A thickness of the first layer may be about 50 nm to about 90 nm, a thickness of the second layer may be about 10 nm to about 25 nm, and a thickness of the fourth layer may be about 20 nm to about 45 nm.

The window may further include a fifth layer disposed between the base layer and the first layer, and including magnesium oxide.

The window may further include a sixth layer disposed between the base layer and the first layer, and including zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), tungsten oxide ($WO_3$), and/or aluminum nitride (AlN).

The window may further include a seventh layer disposed below the base layer, and including magnesium oxide, magnesium fluoride, and/or yttrium oxyfluoride.

A display device includes a display module and a window disposed on the display module. The window includes a base layer, a first layer disposed on the base layer, a second layer disposed on the first layer, a third layer disposed on the second layer, and a fourth layer disposed on the third layer. The second layer includes silicon dioxide ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). The third layer includes iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti).

The display module may include a base substrate, a circuit layer disposed on the base substrate, a light emitting element layer disposed on the circuit layer, and an anti-reflection layer disposed on the light emitting element layer. The anti-reflection layer may include a partition layer in which a plurality of light emitting elements and a plurality of partition openings respectively overlapping the plurality of light emitting elements are defined. A plurality of color filters may be respectively disposed corresponding to the plurality of partition openings.

The first layer may be spaced apart from the display module with the base layer interposed therebetween.

The upper surface of the fourth floor may define an outermost surface of the window.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
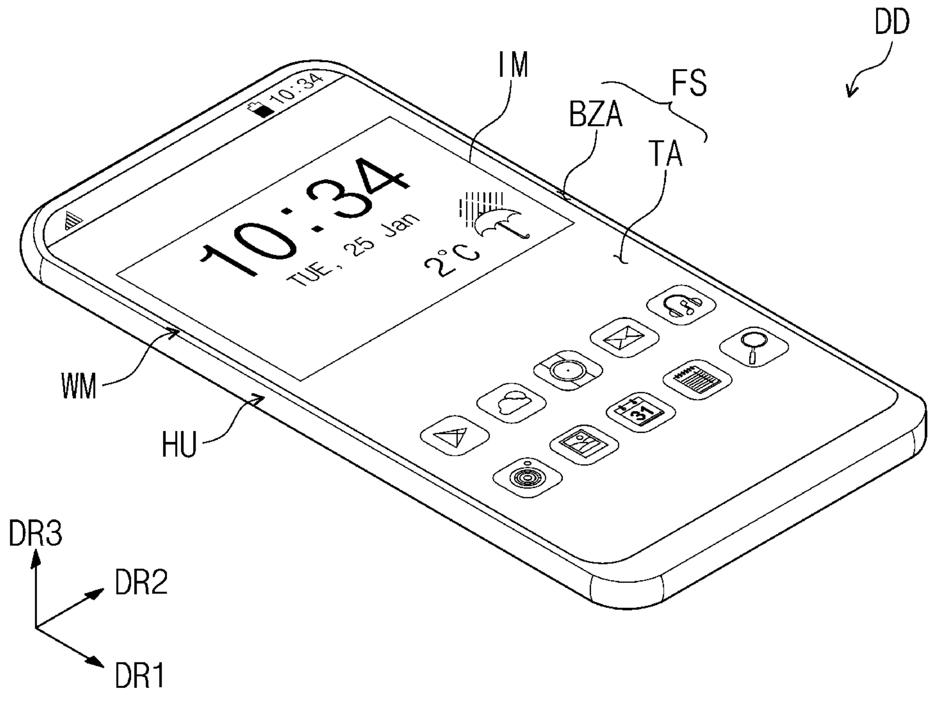
FIG. 1A is a perspective view of a display device, according to an embodiment of the inventive concept.

In the present disclosure, when an element (or a region, a layer, a portion, etc.) is referred to as being "on," "connected to," or "coupled to" another element, it means that the element may be disposed directly on/connected to/coupled to the other element, or that one or more additional elements may be disposed therebetween.

Like reference numerals may refer to like elements throughout the specification and the drawings. Also, in the drawings, the thickness, the ratio, and the dimensions of elements may be exaggerated for an effective description of technical contents. The term "and/or" includes any and all combinations of one or more of which associated elements may define.

It will be understood that, although the terms "first," "second," etc. may be used herein to describe various elements, these elements should not necessarily be limited by these terms. These terms may be used to distinguish one element from another. For example, a first element may be referred to as a second element, and a second element may also be referred to as a first element in a similar manner without departing the scope of rights of the present invention. The terms of a singular form may include plural forms unless the context clearly indicates otherwise.

In addition, terms such as "below," "lower," "above," "upper," and the like are used to describe the relationship of the elements shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof. In contrast, the term "composed" is intended to exclude other elements.

In the present disclosure, being "disposed directly" may mean that there is no layer, film, region, plate, or the like added between a portion of a layer, a film, a region, a plate, or the like and other portions. For example, being "disposed directly" may mean being disposed without additional elements such as an adhesive element between two layers or two elements.

Hereinafter, embodiments of the inventive concept will be described with reference to the accompanying drawings.

Figure 1B:
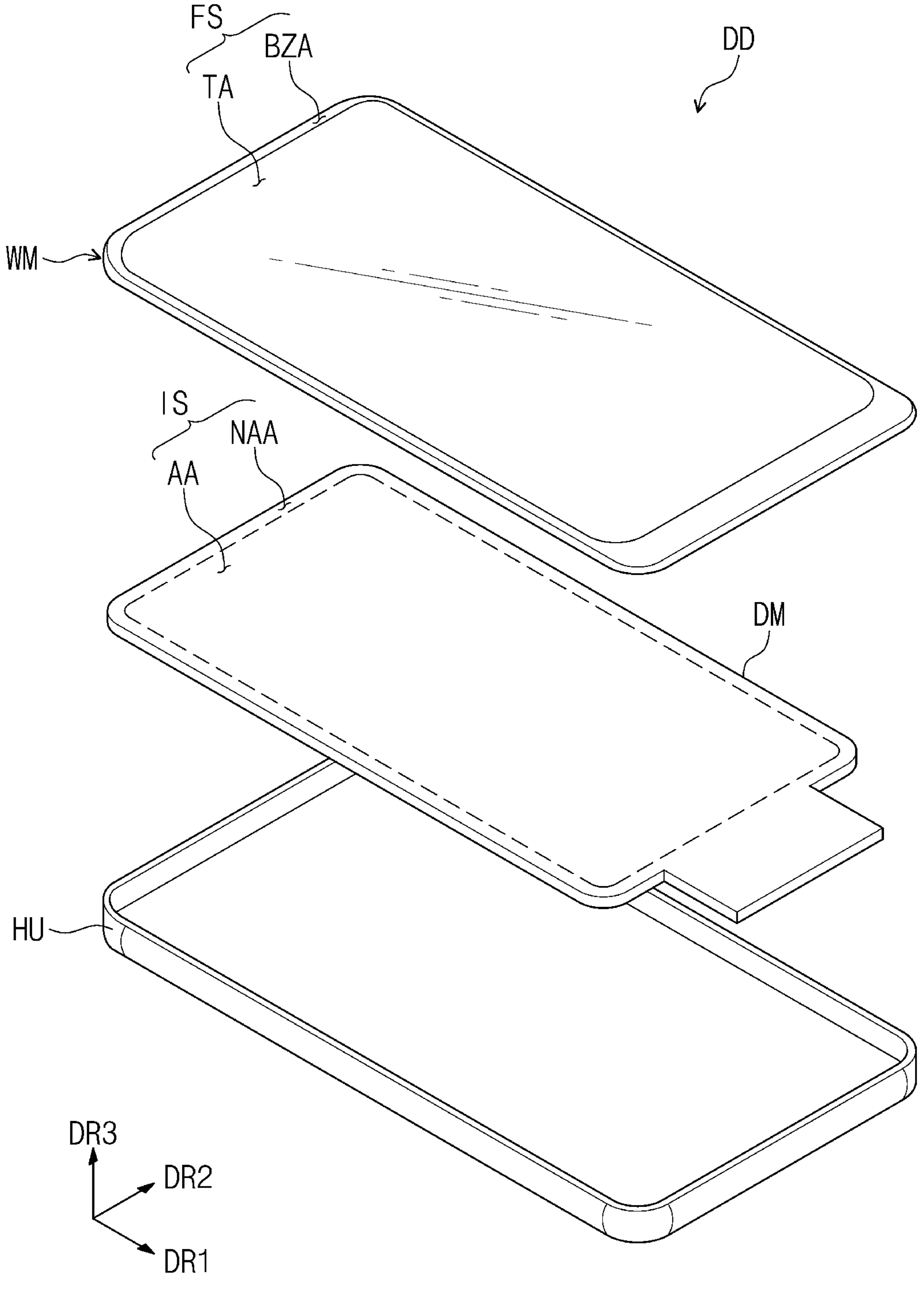
FIG. 1B is an exploded perspective view of a display device, according to an embodiment of the inventive concept.

FIG. 1A is a perspective view of a display device, according to an embodiment of the inventive concept. FIG. 1B is an exploded perspective view of a display device, according to an embodiment of the inventive concept.

Referring to FIG. 1A, a display device DD may be a device activated according to an electrical signal. The display device DD may display an image IM and sense an external input, such as by the action of a touch-screen. The display device DD may be incorporated into various different types of devices. For example, the display device DD may be part of a tablet computer, a laptop computer, a computer monitor, a smart television, and the like. In the present embodiment, the display device DD is exemplarily illustrated as a smart phone.

The display device DD may display the image IM toward a third direction DR3 on a display surface FS that is parallel to each of a first direction DR1 and a second direction DR2. The display surface FS on which the image IM is displayed may correspond to a front surface of the display device DD, and may correspond to a front surface FS of a window WM. Hereinafter, the same reference numeral may be used for the display surface and the front surface of the display device DD, and for the front surface of the window WM. The image IM may include both a moving image and a still image. In FIG. 1A, as an example of the image IM, a watch and a plurality of icons are illustrated.

In the present embodiment, a front surface (or an upper surface) and a back surface (or a lower surface) of each element are defined on the basis of a direction in which the image IM is displayed. The front surface and the rear surface oppose each other in the third direction DR3 and the normal direction of each of the front surface and the rear surface may be parallel to the third direction DR3. The separation distance between the front surface and the rear surface in the third direction DR3 may correspond to the thickness of a display panel 100 in the third direction DR3. Directions indicated by the first to third directions DR1, DR3, and DR3 are a relative concept, and may be converted to different directions. Hereinafter, first to third directions are directions indicated by the first to third directions DR1, DR2, and DR3, respectively, and are given the same reference numerals. In addition, in the present disclosure, "on a plane" or "in a plan view" may mean when viewed in the third direction DR3.

The display device DD, according to an embodiment of the inventive concept, may sense a user input applied from the outside. The user input includes various forms of external inputs such as a touch by a part of a user's body, light, heat, or pressure. The user input may be provided in various forms, and the display device DD may sense the user input applied to a side surface or a rear surface of the display device DD, depending on the structure of the display device DD, but the embodiment of the inventive concept is not necessarily limited to any one embodiment.

As illustrated in FIG. 1A and FIG. 1B, the display device DD includes the window WM, a display module DM, and an external case HU. In the present embodiment, the window WM and the external case HU are coupled together to constitute the external appearance of the illustrated device DD. In the present embodiment, the external case HU, the display module DM, and the window WM may be sequentially stacked along the third direction DR3.

The window WM may include an optically transparent material. The window WM may include an insulation panel. For example, the window WM may be composed of glass, plastic, or a combination thereof.

The front surface FS of the window WM defines the front surface of display device DD as described above. The transmissive region TA may be an optically transparent region. For example, the transmissive region TA may be a region having a visible light transmittance of about 90% or higher.

A bezel region BZA may be a region having a relatively low light transmittance compared to the transmissive region TA. The bezel region BZA defines the shape of the transmissive region TA. The bezel region BZA may be adjacent to the transmissive region TA, and may at least partially surround the transmissive region TA.

The bezel region BZA may have a predetermined color. The bezel region BZA may cover a peripheral region NAA of the display module DM to block the peripheral region NAA from being viewed from the outside. However, this arrangement is only exemplarily illustrated, and in the window WM, according to an embodiment of the inventive concept, the bezel region BZA may be omitted.

The display module DM may display the image IM and may sense an external input. The image IM may be displayed on a front surface IS of the display module DM. The front surface IS of the display module DM includes an active region AA and a peripheral region NAA. The active region AA may be a region activated according to an electrical signal.

In the present embodiment, the active region AA may be a region in which the image IM is displayed, and at the same time, may be a region in which an external input is sensed. The transmissive region TA overlaps at least the active region AA. For example, the transmissive region TA overlaps a front surface or at least a portion of the active region AA. Accordingly, a user may visually recognize the image IM through the transmissive region TA, or may provide an external input. However, this is only exemplary, and in the active region AA, a region in which the image IM is displayed and a region in which an external input is sensed may be separated from each other, but the embodiment of the inventive concept is not necessarily limited to any one embodiment.

The peripheral region NAA may be a region covered by the bezel region BZA. The peripheral region NAA is adjacent to the active region AA. The peripheral region NAA may at least partially surround the active region AA. In the peripheral region NAA, a driving circuit, a driving line, or the like for driving the active region AA may be disposed.

The display module DM may include a display panel and a sensor layer. The image IM may substantially be displayed on the display panel, and an external input may substantially be sensed in the sensor layer. The display module DM includes both the display panel and the sensor layer, and thus, may display the image IM and sense an external input at the same time. A detailed description thereof will be given later.

The display device DD of an embodiment may further include a driving circuit. The driving circuit may include a flexible circuit board and a main circuit board. The flexible circuit board may be electrically connected to the display module DM. The flexible circuit board may connect the display module DM and the main circuit board to one another. However, this is exemplarily illustrated, and the flexible circuit board, according to the inventive concept, might not be connected to the main circuit board, or the flexible circuit substrate may be a rigid substrate.

The flexible circuit board may be connected to pads of the display module DM disposed in the peripheral region NAA. The flexible circuit board may provide an electrical signal for driving the display module DM to the display module DM. The electrical signal may be generated in the flexible circuit board or may be generated in the main circuit board. The main circuit board MB may include various driving circuits for driving the display module DM, connectors for supplying power, or the like. The main circuit board may be connected to the display module DM through the flexible circuit board.

FIG. 1B exemplarily illustrates the display module DM in an unfolded state, but at least a portion of the display module DM may be bent. In the present embodiment, a portion of the display module DM may be bent toward a rear surface of the display module DM, and the portion bent toward the rear surface may be a portion to which the main circuit board is connected. Accordingly, the main circuit board may be assembled while overlapping the rear surface of the display module DM.

The external case HU is coupled to the window WM and defines the appearance of the display device DD. The external case HU provides a predetermined internal space. The display module DM may be accommodated in the internal space.

The external case HU may include a material having a relatively high rigidity. For example, the external case HU may include glass, plastic, or a metal, or may include a plurality of frames and/or plates composed of a combination thereof. The external case HU may stably protect components of the display device DD, which are accommodated in the internal space, from an external impact.

Figure 2:
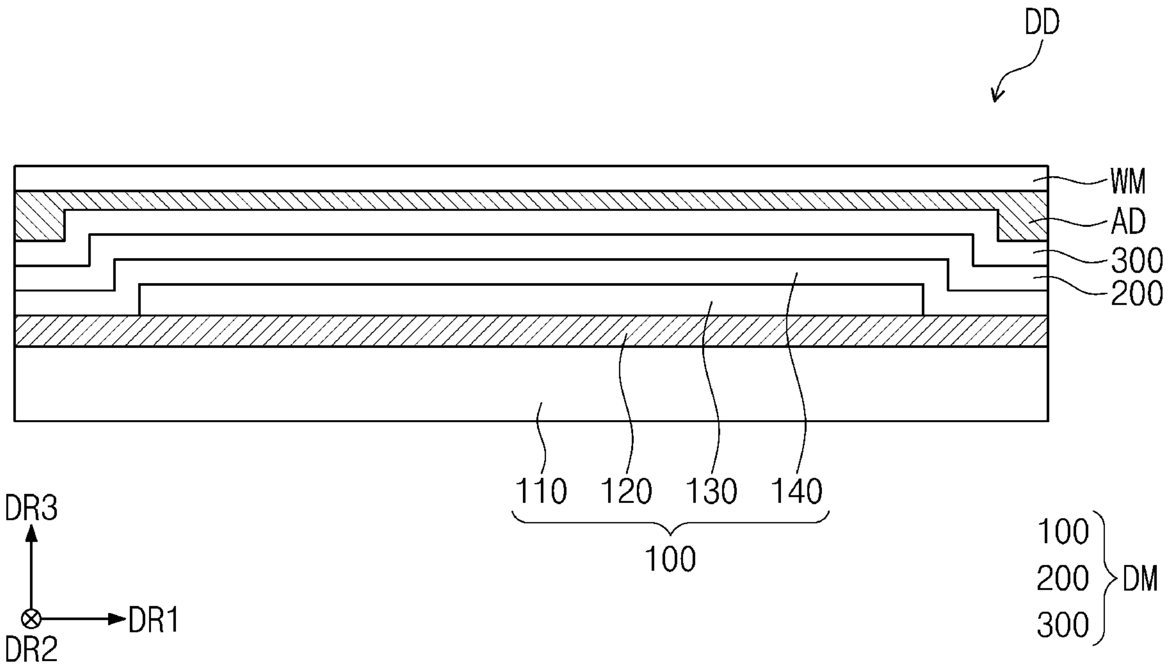
FIG. 2 is a cross-sectional view of a display device, according to an embodiment of the inventive concept.

FIG. 2 is a cross-sectional view of a display device according to an embodiment of the inventive concept.

Referring to FIG. 2, the display device DD may include the display module DM and the window WM. The display module DM and the window WM may be coupled to one another with an adhesive layer AD. In the display device DD of an embodiment, the display module DM may include a display panel 100, a sensor layer 200, and an anti-reflection layer 300. Among a plurality of layers of the display module DM, the anti-reflection layer 300 may be coupled to the window WM through the adhesive layer AD.

The display panel 100 may be a component which substantially generates an image. The display panel 100 may be a light-emitting type display panel. For example, the display panel 100 may be an organic light emitting display panel, an inorganic light emitting display panel, a micro-LED display panel, or a nano-LED display panel. The display panel 100 may also be referred to as a display layer.

The display panel 100 may include a base substrate 110, a circuit layer 120, a light emitting element layer 130, and an encapsulation layer 140.

The base substrate 110 may be an element which provides a base surface on which the circuit layer 120 is disposed. The base substrate 110 may be a rigid substrate, or a flexible substrate capable of bending, folding, rolling, and the like. The base substrate 110 may be a glass substrate, a metal substrate, a polymer substrate, or the like. However, the embodiment of the inventive concept is not necessarily limited thereto, and the base substrate 110 may be an inorganic layer, an organic layer, or a composite material layer.

The base substrate 110 may have a multi-layered structure. For example, the base substrate 110 may include a first synthetic resin layer, a multi-layered or single-layered inorganic layer, and a second synthetic resin layer disposed above the multi-layered or single-layered inorganic layer. Each of the first and second synthetic resin layers may include a polyimide-based resin, but is not necessarily limited thereto.

The circuit layer 120 may be disposed on the base substrate 110. The circuit layer 120 may include an insulation layer, a semiconductor pattern, a conductive pattern, a signal line, and the like.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro-LED, or a nano-LED.

The encapsulation layer 140 may be disposed on the light emitting element layer 130. The encapsulation layer 140 may protect the light emitting element layer 130 from foreign materials such as moisture, oxygen, and dust particles. The encapsulation layer 140 may include at least one inorganic layer. The encapsulation layer 140 may include a stacked structure of an inorganic layer/an organic layer/an inorganic layer.

The sensor layer 200 may be disposed on the display panel 100. The sensor layer 200 may sense an external input. The external input may be a user input. The user input may include various forms of external inputs, such as a part of a user's body, light, heat, a pen, a pressure, or the like.

The sensor layer 200 may be provided on the display panel 100 through a continuous process. In this case, the sensor layer 200 may be disposed directly on the display panel 100. Here, "disposed directly" may mean that a third component is not disposed between the sensor layer 200 and the display panel 100. For example, a separate adhesive element might not be disposed between the sensor layer 200 and the display panel 100.

The anti-reflection layer 300 may be disposed directly on the sensor layer 200. The anti-reflection layer 300 may reduce the reflectance of external light incident from the outside of the display device DD. The anti-reflection layer 300 may be provided above the sensor layer 200 through a continuous process. The refection prevention layer 300 may include color filters. The color filters may have a predetermined arrangement. For example, the color filters may be arranged in consideration of light emission colors of pixels included in the display panel 100. In addition, the anti-reflection layer 300 may further include a black matrix adjacent to the color filters. The anti-reflection layer 300 will be described in detail later.

In an embodiment of the inventive concept, the sensor layer 200 may be omitted. In this case, the anti-reflection layer 300 may be disposed directly on the display panel 100. In an embodiment of the inventive concept, positions of the sensor layer 200 and anti-reflection layer 300 are interchangeable.

In an embodiment of the inventive concept, the display device DD may further include an optical layer disposed above the anti-reflection layer 300. For example, the optical layer may be formed above the anti-reflection layer 300 through a continuous process. The optical layer may increase front-surface luminance of the display device DD by controlling the direction of light incident from the display panel 100. For example, the optical layer may include an organic insulation layer in which openings are defined respectively corresponding to light emitting regions of the pixels included in the display panel 100, and a highly-refractive layer covering the organic insulation layer and filled in the openings. The highly-refractive layer may have a refractive index that is higher than that of the organic insulation layer.

The window WM may provide the front surface of display device DD. The window WM may include a glass a film or a synthetic resin film as a base film. The window WM may further include functional layers such as an anti-reflection layer or an anti-fingerprint layer. The functional layers included in the window WM will be described in detail with reference to FIG. 4A and FIG. 5B. The window WM may further include a bezel pattern overlapping the above-described bezel region BZA (see FIG. 1B).

Figure 3:
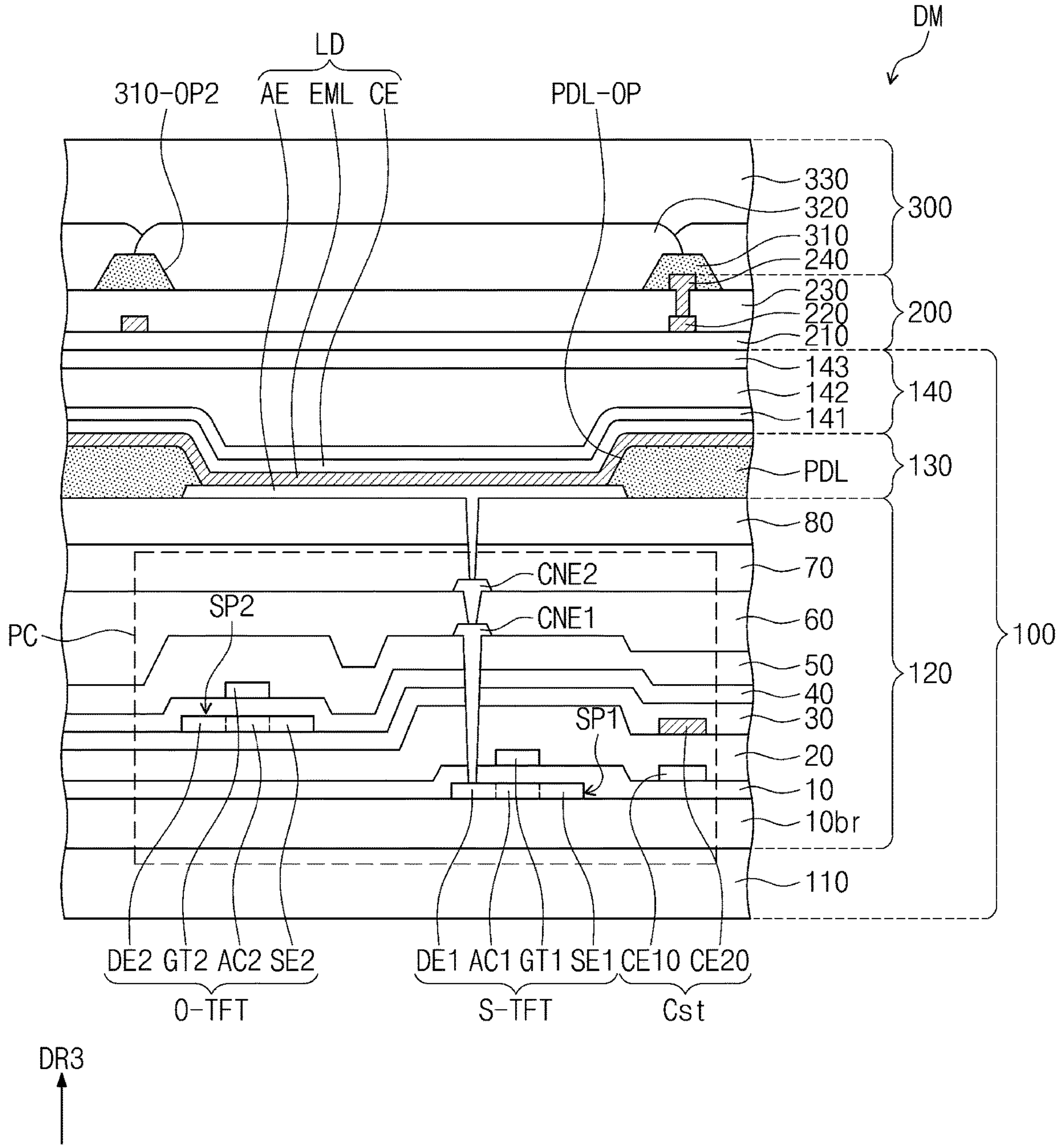
FIG. 3 is a cross-sectional view showing a portion of a display module, according to an embodiment of the inventive concept.

FIG. 3 is a cross-sectional view showing a portion of a display module, according to an embodiment of the inventive concept. In FIG. 3, a partial cross-section of one light emitting element LD and a pixel circuit PC included in the display module DM is illustrated.

The display panel 100 included in the display module DM of an embodiment may include the base substrate 110. The base substrate 110 may be an element which provides a base surface on which the circuit layer 120 is disposed. The base substrate 110 may be a glass substrate, a metal substrate, a plastic substrate, or a silicon substrate. However, the embodiment of the inventive concept is not necessarily limited thereto, and the base substrate 110 may be an inorganic layer, an organic layer, or a composite material layer.

A buffer layer 10*br* may be disposed on the base substrate 110. The buffer layer 10*br* may prevent a phenomenon in which metal atoms or impurities from the base layer 110 diffuse into a first semiconductor pattern SP1 on an upper side. The first semiconductor pattern SP1 includes a channel region AC1 of a silicon transistor S-TFT. The buffer layer 10*br* may control the rate of providing heat during a crystallization process for forming the first semiconductor pattern so as to allow the first semiconductor pattern SP1 to be uniformly formed.

The first semiconductor pattern SP1 may be disposed on the buffer layer 10*br*. The first semiconductor pattern SP1 may include a silicon semiconductor. For example, the silicon semiconductor may include amorphous silicon, polycrystalline silicon, monocrystalline silicon, or the like. For example, the first semiconductor pattern SP1 may include low-temperature polysilicon.

FIG. 3 illustrates a portion of the first semiconductor pattern SP1 disposed on the buffer layer 10*br*, and the first semiconductor pattern SP1 may be further disposed in other regions.

The first semiconductor pattern SP1 may be arranged across pixels according to a specific rule. The first semiconductor pattern SP1 may have different electrical properties depending on whether or not it is doped. The first semiconductor pattern SP1 may include a first region having relatively high conductivity and a second region having relatively low conductivity. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region, or a region doped to a concentration lower than that of the first region.

The conductivity of the first region may be greater than the conductivity of the second region, and the first region may substantially serve as an electrode or a signal line. The second region may substantially correspond to an active region (or a channel) of a transistor. A portion of the first semiconductor pattern SP1 may be an active region of a transistor, and another portion thereof may be a source or a drain of the transistor, and the other portion thereof may be a connection electrode or a connection signal line.

A source region SE1 (or a source), the channel region AC1 (or a channel), and a drain region DE1 (or a drain) of the silicon transistor S-TFT may be formed from the first semiconductor pattern SP1. The source region SE1 and the drain region DE1 may extend in opposite directions from the channel region AC1 on a cross-section.

A rear metal layer may be disposed under the silicon transistor S-TFT and under an oxide transistor O-TFT, respectively. The rear metal layer may overlap the pixel circuit PC, and may block external light from reaching the pixel circuit PC. The rear metal layer may be disposed between the base substrate 110 and the buffer layer 10*br*.

Alternatively, the rear metal layer may be disposed between a second insulation layer 20 and a third insulation layer 30. The rear metal layer may include a reflective metal. For example, the rear metal layer may include silver (Ag), an alloy containing silver, molybdenum (Mo), an alloy containing molybdenum, aluminum (Al), an alloy containing aluminum, an aluminum nitride (AlN), tungsten (W), a tungsten nitride (WN), copper (Cu), p+ doped amorphous silicon, or the like. The rear metal layer may be connected to an electrode or a line, and may receive a constant voltage or a signal from the electrode or the line. According to an embodiment of the inventive concept, the rear metal layer may be a floating electrode in an isolated form from another electrode or line. In an embodiment of the inventive concept, an inorganic barrier layer may be further disposed between the base substrate 110 and the buffer layer 10*br*.

A first insulation layer 10 may be disposed on the buffer layer 10*br*. The first insulation layer commonly overlaps a plurality of pixels, and may cover the first semiconductor pattern SP1. The first insulation layer 10 may be an inorganic layer and/or an organic layer, and may have a single-layered or multi-layered structure. The first insulation layer 10 may include aluminum oxide, titanium oxide, silicon oxide, silicon nitride, silicon oxynitride, zirconium oxide, and/or hafnium oxide. In the present embodiment, the first insulation layer 10 may be a single-layered silicon oxide layer. Not only the first insulation layer 10 but also an insulation layer of the circuit layer 120, to be described later, may be an inorganic layer and/or an organic layer, and may have a single-layered structure or multi-layered structure. The inorganic layer may include at least one of the above-described materials, but is not necessarily limited thereto.

A gate GT1 of the silicon transistor S-TFT is disposed on the first insulation layer 10. The gate GT1 may be a portion of a metal pattern. The gate GT1 overlaps the channel region AC1. In a process of doping the first semiconductor pattern SP1, the gate GT1 may serve as a mask. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), or the like, but is not necessarily limited thereto.

The second insulation layer 20 is disposed on the first insulation layer 10, and may cover the gate GT1. The third insulation layer 30 may be disposed on the second insulation layer 20. A second electrode CE20 of a storage capacitor Cst may be disposed between the second insulation layer 20 and the third insulation layer 30. In addition, a first electrode CE10 of the storage capacitor Cst may be disposed between the first insulation layer 10 and the second insulation layer 20.

A second semiconductor pattern SP2 may be disposed on the third insulation layer 30. The second semiconductor pattern SP2 may include a channel region AC2 of the oxide transistor O-TFT to be described later. The second semiconductor pattern SP2 may include an oxide semiconductor. The second semiconductor pattern SP2 may include a transparent conductive oxide (TCO) such as indium tin oxide (ITO), indium zinc oxide (IZO), indium gallium zinc oxide (IGZO), zinc oxide (ZnO), indium oxide ($In_2O_3$), or the like.

The oxide semiconductor may include a plurality of regions which are distinguished depending on whether the transparent conductive oxide has been reduced or not. A region in which the transparent conductive oxide has been reduced (hereinafter, a reduction region) has conductivity greater than that of a region in which the transparent conductive oxide has not been reduced (hereinafter, a non-reduction region). The reduction region substantially serves as a source/drain or signal line of a transistor. The non-reduction region substantially corresponds to a semiconductor region (or an active region or a channel) of a transistor. A partial region of the second semiconductor pattern SP2 may be a semiconductor region of a transistor, another partial region thereof may be a source region/drain region of the transistor, and the other partial region thereof may be a signal transmissive region.

A source region SE2 (or a source), the channel region AC2 (or a channel), and a drain region DE2 (or a drain) of the oxide transistor O-TFT may be formed from the first semiconductor pattern SP2. The source region SE2 and the drain region DE2 may extend in opposite directions from the channel region AC2 on a cross-section.

A fourth insulation layer 40 may be disposed on the third insulation layer 30. The fourth insulation layer commonly overlaps a plurality of pixels, and may cover the second semiconductor pattern SP2. The fourth insulation layer 40 overlaps a gate GT2 of the oxide transistor O-TFT, and may be provided in the form of an insulation pattern which exposes the source region SE2 and the drain region DE2 of the oxide transistor O-TFT.

The gate GT2 of the oxide transistor O-TFT is disposed on the fourth insulation layer 40. The gate GT2 of the oxide transistor O-TFT may be a portion of a metal pattern. The gate GT2 of the oxide transistor O-TFT overlaps the channel region AC2.

A fifth insulation layer 50 is disposed on the fourth insulation layer 40, and may cover the gate GT2. A first connection electrode CNE1 may be disposed on the fifth insulation layer 50. The first connection electrode CNE1 may be connected to the drain region DE1 of the silicon transistor S-TFT through a contact-hole passing through the first to fifth insulation layers 10, 20, 30, 40, and 50.

A sixth insulation layer 60 may be disposed on the fifth insulation layer 50. A second connection electrode CNE2 may be disposed on the sixth insulation layer 60. The second connection electrode CNE2 may be connected to the first connection electrode CNE1 through a contact-hole passing through the sixth insulation layer 60. A seventh insulation layer 70 is disposed on the sixth insulation layer 60, and may cover the second connection electrode CNE2. An eighth insulation layer 80 may be disposed on the seventh insulation layer 70.

The sixth insulation layer 60, the seventh insulation layer 70, and the eighth insulation layer 80 may each be an organic layer. For example, the sixth insulation layer 60, the seventh insulation layer 70, and the eighth insulation layer 80 may each include a general purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light emitting element LD may include a first electrode AE (or a pixel electrode), a light emitting layer EML, and a second electrode CE (or a common electrode). The light emitting layer EML and the second electrode CE may each be commonly provided to a plurality of pixels.

The first electrode AE of the light emitting element LD may be disposed on the eighth insulation layer 80. The first electrode AE of the light emitting element LD may be a (semi)transmissive electrode or a reflective electrode.

According to an embodiment of the inventive concept, each of the first electrodes AE of the light emitting elements LD may include a reflective layer formed of Ag, Mg, Al, Pt, Pd, Au, Ni, Nd, Ir, Cr, or a compound thereof, and a transparent or translucent electrode layer formed on the reflective layer. The transparent or translucent electrode layer may be provided with indium tin oxide (ITO), indium zinc oxide (IZO), indium gallium zinc oxide (IGZO), zinc oxide (ZnO) or indium oxide ($In_2O_3$), and/or aluminum-doped zinc oxide (AZO). For example, the first electrode AE of the light emitting element LD may include a stacked structure of ITO/Ag/ITO.

A pixel definition film PDL may be disposed on the eighth insulation layer 80. The pixel definition film PDL may have properties of absorbing (or reflecting) light, and for example, the pixel definition film PDL may have a black color. The pixel definition film PDL may include a black coloring agent. The black coloring agent may include a black dye and a black pigment. The black coloring agent may include carbon black, a metal such as chromium, or an oxide thereof. The pixel definition film PDL may correspond to a light blocking pattern having light blocking properties.

The pixel definition film PDL may cover a portion of the first electrode AE of the light emitting element LD. For example, on the pixel definition film PDL, an opening PDL-OP which exposes a portion of the first electrode AE of the light emitting element LD may be defined. The pixel definition film PDL may increase the distance between an edge of the first electrode AE and the second electrode CE of the light emitting element LD. Therefore, the pixel definition film PDL may serve to prevent arcs and the like from occurring at edges of the first electrodes AE.

A hole control layer may be disposed between the first electrode AE and the light emitting layer EML. The hole control layer includes a hole transport layer, and may further include a hole injection layer. An electron control layer may be disposed between the light emitting layers EML and the second electrode CE. The electron control layer includes an electron transport layer, and may further include an electron injection layer. The hole control layer and the electron control layer may be commonly provided to a plurality of pixels using an open mask.

The encapsulation layer 140 may be disposed on the light emitting element layer 130. The encapsulation layer 140 may include an inorganic layer 141, an organic layer 142, and an inorganic layer 143 sequentially stacked, but layers constituting the encapsulation layer 140 are not necessarily limited thereto.

The inorganic layers 141 and 143 may protect the light emitting element layer 130 from moisture and oxygen, and the organic layer 142 may protect the light emitting element layer 130 from foreign materials such as dust particles. The inorganic layers 141 and 143 may include a silicon nitride layer, a silicon oxynitride layer, a silicon oxide layer, a titanium oxide layer, an aluminum oxide layer, or the like. The organic layer 142 may include an acrylic organic layer, but is not necessarily limited thereto.

The sensor layer 200 may be disposed on the display panel 100. The sensor layer 200 may be referred to as a sensor, an input sensing layer, or an input sensing panel. The sensor layer 200 may include a sensor base layer 210, a first conductive layer 220, a sensing insulation layer 230, a second conductive layer 240.

The sensor base layer 210 may be disposed directly on the display panel 100. The sensor base layer 210 may be an inorganic layer including silicon nitride, silicon oxynitride, and/or silicon oxide. Alternatively, the sensor base layer 210 may be an organic layer including an epoxy resin, an acrylic resin, or an imide-based resin. The sensor base layer 210 may have a single-layered structure, or a multi-layered structure in which layers are stacked along the third direction DR3.

Each of the first conductive layer 220 and the second conductive layer 240 may have a single-layered structure, or a multi-layered structure in which layers are stacked along the third direction DR3. The first conductive layer 220 and the second conductive layer 240 may include conductive lines which define a sensing electrode in a mesh shape. The conductive lines might not overlap the opening PDL-OP, and may overlap the pixel definition film PDL.

A conductive layer of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as PEDOT, a metal nanowire, graphene, or the like.

A conductive layer of a multi-layered structure may include metal layers. The metal layers may have, for example, a three-layered structure of titanium/aluminum/titanium. The conductive layer of a multi-layered structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may include aluminum oxide, titanium oxide, silicon oxide, silicon nitride, silicon oxynitride, zirconium oxide, and/or hafnium oxide.

Alternatively, the sensing insulation layer 230 may include an organic film. The organic film may include an acrylic resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The anti-reflection layer 300 may be disposed on the sensor layer 200. The anti-reflection layer 300 may include a light blocking pattern 310, a plurality of color filters 320, and a planarization layer 330.

The anti-reflection layer 300 may lower the reflectance of external light. The anti-reflection layer 300 includes the plurality of color filters 320, and the plurality of color filters 320 may have a predetermined arrangement. The plurality of color filters 320 may be arranged in consideration of emission colors of the pixels included in the display panel 100. In the display module DM of an embodiment, the anti-reflection layer 300 might not include a phase retarder and a polarizer, and may reduce the reflectance of the display module DM through the plurality of color filters 320. In the display module DM of an embodiment, the anti-reflection layer 300 might not include a polarizing film or a polarizing layer.

A material constituting the light blocking pattern 310 is not necessarily limited to the materials described above as long as it is a material which absorbs light. The light blocking pattern 310 is a layer having a black color, and in an embodiment, the light blocking pattern 310 may include a black coloring agent. The black coloring agent may include a black dye and a black pigment. The black coloring agent may include carbon black, a metal such as chromium, or an oxide thereof.

The light blocking pattern 310 may cover the second conductive layer 240 of the sensor layer 200. The light blocking pattern 310 may prevent reflection of external light by the second conductive layer 240. The light blocking pattern 310 may overlap a portion of the pixel definition film PDL.

A partition opening 310-OP2 may be defined in the light blocking pattern 310. The partition opening 310-OP2 may overlap with the first electrode AE of the light emitting element LD. Any one of the plurality of color filters 320 may overlap with the first electrode AE of the light emitting element LD. Any one of the plurality of color filters 320 may cover the partition opening 310-OP2. Each of the plurality of color filters 320 may be in contact with the light blocking pattern 310.

The planarization layer 330 may cover the light blocking pattern 310 and the color filter 320. The planarization layer 330 may include an organic substance, and a flat surface may be provided on an upper surface of the planarization layer 330. In an embodiment of the inventive concept, the planarization layer 330 may be omitted.

FIG. 4A to FIG. 4D are each a cross-sectional view of a window according to an embodiment of the inventive concept.

Figure 4A:
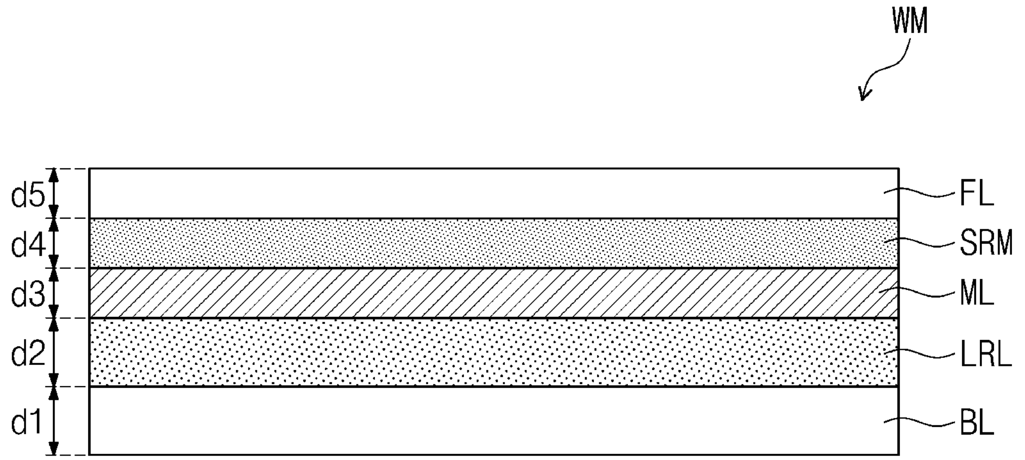
FIG. 4A to FIG. 4D are cross-sectional views of a window, according to an embodiment of the inventive concept.

Referring to FIG. 4A, the window WM of an embodiment of the inventive concept includes a base layer BL, a first layer LRL, a second layer ML, a third layer SRM, and a fourth layer FL. In the window WM of an embodiment, the base layer BL, the first layer LRL, the second layer ML, the third layer SRM, and the fourth layer FL may be sequentially stacked.

The base layer BL may include a transparent material. In an embodiment, the base layer BL may include glass, tempered glass, or a polymer film. In an embodiment, the base layer BL may be a chemically reinforced glass substrate. When the base layer BL is a chemically reinforced glass substrate, the base layer BL may have increased mechanical strength while being thin, and thus, may be used for a window of a foldable display device. When the base layer BL includes a polymer film, the base layer BL may include a polyimide (PI) film or a polyethylene terephthalate (PET) film. The base layer BL of the window WM may have a multi-layered structure or single-layered structure. For example, the base layer BL may have a structure in which a plurality polymer films are coupled through an adhesive element, or may have a structure in which a glass substrate and a polymer film are coupled with an adhesive. The base layer BL may be made of a soft material.

Figure 4B:
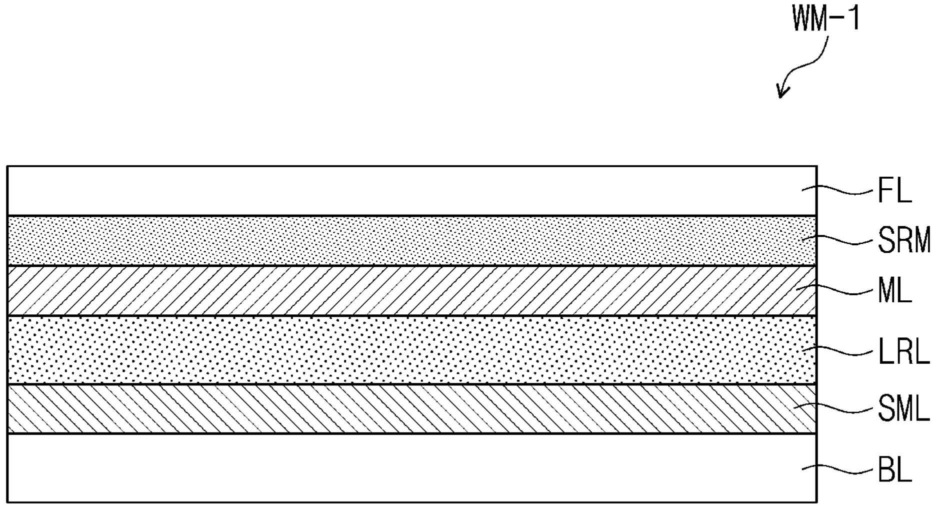

The base layer BL may have a thickness d1 of, for example, about 20 μm to about 60 μm. Preferably, the thickness d1 of the base layer BL may be about 20 μm to about 40 μm. FIG. 4A and FIG. 4B exemplarily illustrate the base layer BL having a rectangular shape, but the embodiment of the inventive concept is not necessarily limited thereto, and the base layer BL according to an embodiment may have a shape in which an edge portion of an upper surface of the base layer BL is rounded by a curved surface. For example, the base layer BL may have a shape in which an edge portion of an upper surface thereof overlapping the bezel region BZA (see FIG. 1B) is rounded by a curved surface.

The first layer LRL is a layer having a refractive index that is lower than that of the base layer BL, and may be a layer for reducing surface reflectance of the window WM. The first layer LRL may be disposed on the base layer BL. The first layer LRL may be a layer disposed directly on the base layer BL. The first layer LRL is disposed on the upper surface of the base layer BL, and a lower surface of the base layer BL may be a surface adjacent to the above-described display module DM (see FIG. 2). For example, the first layer LRL may be spaced apart from the display module DM with the base layer BL interposed therebetween.

The first layer LRL may include a material with a low refractive index, and with excellent adhesion to the base layer BL. The first layer LRL may include a first material, and the first material may include a material having a lower refractive index than a material included in the base layer BL. The first material included in the first layer LRL may include silica, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). For example, the first layer LRL may include magnesium fluoride ($MgF_2$) and/or magnesium oxide (MgO) as the first material.

In an embodiment, the first layer LRL may include magnesium fluoride ($MgF_2$). The first layer LRL may be a single layer composed of magnesium fluoride.

Alternatively, the first layer LRL may further include magnesium oxide (MgO) and yttrium oxyfluoride (YOF) in addition to the magnesium fluoride. The first layer LRL may include a solid solution including magnesium oxide in the structure. The first layer LRL may include, for example, a solid solution in which magnesium oxide, magnesium fluoride, and yttrium oxyfluoride are mixed.

The first layer LRL may have a thickness d2 of, for example, about 50 μm to about 90 μm. When the thickness d2 of the first layer LRL is less than about 50 nm, the surface reflectance of the window WM might not be sufficiently reduced. When the thickness d2 of the first layer LRL is greater than about 90 nm, the total thickness of the window WM may increase, thereby excessively increasing the overall thickness of a display device.

At a wavelength of about 550 nm, the refractive index of the first layer LRL may be about 1.3 to about 1.5. In the window WM of an embodiment, at a wavelength of about 550 nm, the refractive index of the first layer LRL may be about 1.38 to about 1.40. As the refractive index of the first layer LRL satisfies the range at a wavelength of about 550 nm, the surface reflectance of the window WM may be reduced.

The first layer LRL may be provided through an ion-assisted deposition process. The first layer LRL may be provided through magnesium oxide, magnesium fluoride, and yttrium oxyfluoride as described above. In a process of providing the first layer LRL, each of magnesium oxide, magnesium fluoride and yttrium oxyfluoride is deposited on a surface of the base layer BL in the form of particles, while an ionized argon (Ar) gas or oxygen ($O_2$) gas is provided together during a deposition process, so that the adhesion of a deposition film to the surface of the base layer BL may be increased. Alternatively, the first layer LRL is formed of a single material of magnesium fluoride, and the magnesium fluoride is deposited on a surface of the base layer BL in the form of particles, while an ionized argon (Ar) gas or oxygen ($O_2$) gas is provided together during a deposition process, so that the adhesion of a deposition film to the surface of the base layer BL may be increased.

The first layer LRL may have a single-layered structure formed of a single material. The first layer LRL may be a single layer formed of magnesium fluoride as described above, or a single layer formed of a solid solution in which magnesium oxide, magnesium fluoride, and yttrium oxyfluoride are mixed. For example, the first layer LRL might not include a plurality of layers.

The second layer ML is disposed on the first layer LRL, and may be a layer for increasing adhesion between the first layer LRL and the third layer SRM. The second layer ML may be an adhesion promoter which has excellent adhesion with respect to each of the first layer LRL and the third layer SRM, thereby increasing interlayer adhesion between the first layer LRL and the third layer SRM. The second layer ML may be disposed directly on the first layer LRL.

The second layer ML has excellent mechanical strength while having low refractive properties, and may include a material for increasing adhesion. The second layer ML may include a second material, and the second material may include a material having a lower refractive index than a material included in the base layer BL. The second material included in the second layer ML may include silica, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). For example, the second material may include silicon dioxide ($SiO_2$ or silica), magnesium oxide (MgO), and/or aluminum oxide ($Al_2O_3$).

In an embodiment, the second layer ML may include magnesium oxide (MgO). The second layer ML may further include silicon dioxide ($SiO_2$) in addition to the magnesium oxide. The second layer ML may include a solid solution including magnesium oxide in the structure. The second layer ML may include, for example, a solid solution in which magnesium oxide and silicon dioxide are mixed. As the second layer ML include a solid solution including magnesium oxide, the adhesion thereof to the first layer LRL which also includes magnesium oxide may be increased. Like the first layer LRL, the second layer ML may also be provided through an ion-assisted deposition process.

Alternatively, the second layer ML may include a solid solution having aluminum oxide and silicon dioxide. The second layer ML may include, for example, a solid solution in which aluminum oxide and silicon dioxide are mixed. For example, the second material included in the second layer ML may have a solid solution structure including $Si_9Al_2O_{10}$.

The second layer ML may have a thickness d3 of, for example, about 10 nm to about 25 nm. When the thickness d3 of the second layer ML is less than about 10 nm, an effect of increasing adhesion between the first layer LRL and the third layer SRM might not be implemented, and the mechanical strength of the window WM may be reduced. When the thickness d3 of the second layer ML is greater than about 25 nm, the reflectance of the window WM may increase, and the total thickness of the window WM may increase, thereby excessively increasing the overall thickness of a display device.

At a wavelength of about 550 nm, the refractive index of the second layer ML may be about 1.3 to about 1.6. In the window WM of an embodiment, at a wavelength of about 550 nm, the refractive index of the second layer ML may be about 1.45 to about 1.50. As the refractive index of the second layer ML satisfies the range at a wavelength of about 550 nm, the surface reflectance of the window WM may be reduced. The second layer ML may have a high refractive index compared to the first layer LRL.

The second layer ML may have a single-layered structure formed of a single material. The second layer ML may be a single layer formed of solid solution in which magnesium oxide and silicon dioxide are mixed as described above, or a single layer formed of a solid solution in which aluminum oxide and silicon dioxide are mixed. The second layer ML may be a single layer formed of $Si_9Al_2O_{10}$. For example, the second layer ML might not include a plurality of layers.

The third layer SRM is disposed on the second layer ML, and may be a layer for increasing chemical-resistance, solvent-resistance, and grinding-resistance of the window WM. The third layer SRM may have excellent adhesion to each of the second layer ML and the fourth layer FL, thereby not degrading wear resistance of the window WM. The third layer SRM may be disposed directly on the second layer ML.

The third layer SRM may be a metal material layer with excellent chemical resistance and solvent resistance. The third layer SRM has excellent mechanical strength, and may include a metal material with excellent chemical resistance and solvent resistance. The third layer SRM may be a layer including a solvent-resistant metal. In the present specification, a "solvent-resistance metal" refers to a metal having resistance such hat a metal film formed from the corresponding metal is not worn and lost with respect to a chemical such as alcohol, and the solvent-resistant metal may include, for example, iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti).

The third layer SRM includes iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti). For example, the third layer SRM may include iron (Fe), copper (Cu), and/or nickel (Ni).

Like the first layer LRL and the second layer ML, the third layer SRM may also be provided through an ion-assisted deposition process. However, the embodiment of the inventive concept is not necessarily limited thereto, and the third layer SRM may be provided through various deposition methods. For example, the third layer SRM may also be formed through atomic layer deposition (ALD).

The third layer SRM may have a thickness d4 of, for example, about 2 nm to about 10 nm. When the thickness d4 of the third layer SRM is less than about 2 nm, it is difficult to uniformly deposit a metal film for forming the third layer SRM, so that a film having a uniform thickness is not formed, and as a result, an effect of increasing the chemical resistance and solvent resistance of the window WM might not be implemented. When the thickness of the third layer SRM is greater than about 10 nm, external light reflectance of the window WM may increase due to a thick metal film and color shift may occur, so that when the third layer SRM is applied to a display device, the display device may have reflective color defects.

The third layer SRM may be a single layer including one of the above-described solvent-resistant metals, or a single layer including an alloy in which two or more metals of the above-described solvent-resistant metals are mixed. For example, the third layer SRM may be a single metal layer composed of iron (Fe). Alternatively, the third layer SRM may be a single metal layer composed of copper (Cu) or nickel (Ni).

The fourth layer FL is disposed on the third layer SRM, and may be a layer which increases slip properties, scratch resistance, and the like of a surface of the window WM. In an embodiment, the fourth layer FL may be an anti-fingerprint layer having excellent fingerprint resistance and suppressing surface wear. The fourth layer FL may be disposed directly on the third layer SRM. The fourth layer FL is disposed on the uppermost layer of the window WM, and an upper surface of the fourth layer FL may define the uppermost surface of the window WM.

The fourth layer FL may include a material having excellent scratch resistance and slip properties and low refractive properties. In one embodiment, the fourth layer FL may include a fluorine-containing polymer. The fourth layer FL may include, for example, a perfluoropolyether (PFPE) compound. The fourth layer FL may include a perfluoropolyether silane, a perfluoroalkylether alkoxysilane, a perfluoroalkylether copolymer, or the like. As the fourth layer FL include a perfluoropolyether compound, the fingerprint resistance and scratch resistance of the fourth layer FL may be increased.

The fourth layer FL may have a thickness d5 of, for example, about 20 nm to about 45 nm. When the thickness d4 of the fourth layer FL is less than about 20 nm, the fingerprint resistance and scratch resistance of the window WM may be reduced. When the thickness d4 of the fourth layer FL is greater than about 45 nm, the reflectance of the window WM may increase, and the total thickness of the window WM may increase, thereby excessively increasing the overall thickness of a display device.

At a wavelength of about 550 nm, the refractive index of the fourth layer FL may be about 1.3 to about 1.5. In the window WM of an embodiment, at a wavelength of about 550 nm, the refractive index of the fourth layer FL may be about 1.30 to about 1.35. As the refractive index of the fourth layer FL satisfies the range at a wavelength of about 550 nm, the surface reflectance of the window WM may be reduced.

The total sum (d2+d3+d4+d5) of the thickness of each of the first layer LRL, the second layer ML, the third layer SRM, and the fourth layer FL disposed on the base layer BL may be about 160 nm or less. In the window WM of an embodiment, by allowing the total thickness of the first layer LRL, the second layer ML, the third layer SRM, and the fourth layer FL which are disposed on the base layer BL of the window WM to be about 160 nm or less, it is possible to implement a window WM having excellent wear resistance, chemical resistance, griding resistance, and hardness while having low reflection properties.

In the window WM of an embodiment, at a wavelength of about 550 nm, the surface reflectance of the window WM may be about 6.0% or less. The fourth layer FL is disposed on the uppermost layer of the window WM of an embodiment, and at a wavelength of about 550 nm, the reflectance on an upper surface of the fourth layer FL may be about 6.0% or less. At a wavelength of about 550 nm, the reflectance on the upper surface of the fourth layer FL may be about 5.5% to about 5.95%. In the present specification, the "reflectance" of the window WM is defined as a ratio of light reflected to the outside with respect to light incident from the outside toward the inside of the window WM. The light reflected to the outside includes both specularly reflected light that is reflected at the same angle after being incident, and diffused reflected light that is scattered and reflected in various directions. For example, in this specification, the reflectance is defined as specular component included (SCI) reflectance.

Referring to FIG. 1B, FIG. 3, and FIG. 4A together, when the anti-reflection layer 300 included in the display module DM includes a plurality of color filters 320 as in the display device DD of an embodiment, the display efficiency may be increased compared to a case in which a polarizing layer is included, but the reflectance may be increased. In the display device DD, according to an embodiment of the inventive concept, as the window WM includes the first layer LRL, the second layer ML, and the fourth layer FL which include a material having a low refractive index, the surface reflectance of the window WM may be lowered. Accordingly, the reflectance of the entire display device DD may be maintained at a low value.

In the window WM, according to an embodiment of the inventive concept, each of the first layer LRL, the second layer ML, and the fourth layer FL includes a low refractive material, while the second layer ML includes silicon dioxide ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). As the second layer ML includes one of the above materials, the adhesion thereof to the first layer LRL disposed in a lower portion and having low refractive properties may be increased, and as a result, the wear resistance of the window WM may be increased. The window WM of an embodiment includes a structure of the first layer LRL and the second layer ML which are provided as a single layer while securing low refractive properties, wherein the second layer ML includes silicon dioxide, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO), so that the wear resistance properties and mechanical strength may be increased. Accordingly, the durability of the display device DD including the window WM may be increased.

As the window WM, according to an embodiment of the inventive concept, includes the third layer SRM interposed between the second layer ML and the fourth layer FL, the chemical resistance and grinding resistance of the window WM may be increased. When the third layer SRM is not disposed between the second layer ML and the fourth layer FL, the second layer ML may be worn and lost in the chemical resistance evaluation in which friction is applied under conditions in which a solvent such as alcohol is applied, or in the grinding resistance evaluation in which friction is performed through steel-wool, or the like. In the window WM of an embodiment, as the third layer SRM including a solvent-resistant metal with excellent chemical resistance and grinding resistance is disposed in an upper portion of the second layer ML, the limitation in which the second layer ML is lost may be prevented when friction is applied under conditions in which a solvent such as alcohol is applied, and as the second layer ML is protected by the third layer SRM including a metallic material, the limitation in which the second layer ML is lost may be prevented even when friction is applied through steel-wool or the like. Therefore, the chemical resistance and grinding resistance of the window WM may be increased, and accordingly, the durability and reliability of the display device DD including the window WM may be increased.

Table 1 below shows the result of a chemical resistance evaluation of a window of an example, and Table 2 shows the result of a chemical resistance evaluation of a window of a comparative example. Table 3 shows the result of a grinding resistance evaluation of the window of the example, and Table 4 shows the result of a grinding resistance evaluation of the window of the comparative example. In Table 1 to Table 4, the window of the example is a window having a structure in which first to fourth layers are sequentially stacked on a base layer as shown in FIG. 4A, and the window of the comparative example is a window having a structure in which a third layer is not included, unlike the embodiment, and a fourth layer is disposed on a second layer. In the window of the example, the base layer was formed of a glass substrate, the first layer was formed of magnesium fluoride ($MgF_2$) to a thickness of about 70 nm, the second layer was formed of a $Si_9Al_2O_{10}$ solid solution to a thickness of about 15 nm, the third layer was formed of iron (Fe) to a thickness of about 2 nm, and the fourth layer was formed of perfluoropolyether (PFPE) to a thickness of about 36 nm. The window of the comparative example has a stacked structure with the same materials and thicknesses as those of the window of the example except for a Fe layer, which is the third layer in the window of the example.

In Table 1 and Table 2, the chemical resistance evaluation was performed by measuring each of an initial contact angle of a surface of a window and a contact angle of the surface of the window after applying friction thereto 3000 times with a load of 1 kgf through an industrial eraser under conditions in which alcohol was applied, and then comparing the initial angle and the contact angle. In Table 3 and Table 4, the grinding resistance evaluation was performed by measuring each of an initial contact angle of a surface of a window and a contact angle of the surface of the window surface after applying friction thereto 2500 or 3000 times with a load of 1 kgf through steel-wool.

TABLE 1

| Sample | Initial contact angle (°) | | | After chemical resistance (alcohol) 3 K (°) | | |
|---|---|---|---|---|---|---|
| 1 | 116.734 | 117.634 | 117.474 | 101.334 | 101.884 | 101.929 |
| 2 | 118.408 | 117.485 | 118.555 | 100.013 | 101.692 | 108.286 |
| 3 | 117.624 | 116.283 | 118.479 | 105.849 | 101.653 | 105.515 |
| 4 | 118.555 | 118.907 | 117.548 | 102.036 | 106.496 | 102.792 |
| 5 | 119.885 | 118.793 | 119.408 | 102.781 | 101.99 | 105.536 |

TABLE 2

| Sample | Initial contact angle (°) | After chemical resistance (alcohol) 3K (°) |
|---|---|---|
| 1 | 112.9 | 95.9 |
| 2 | 114.9 | 82.8 |
| 3 | 113.1 | 88.2 |
| 4 | 113.2 | 87.3 |
| 5 | 114.8 | 86.8 |
| 6 | 113.9 | 91.7 |

TABLE 3

| Sample | Initial contact angle (°) | After steel-wool 3K (°) |
|---|---|---|
| 1 | 108.6 | 108.1 |
| 2 | 107.1 | 103.6 |
| 3 | 103.8 | 104.5 |
| 4 | 115.3 | 107.5 |
| 5 | 116.0 | 108.5 |
| 6 | 117.1 | 109.7 |

TABLE 4

| Sample | Initial contact angle (°) | After steel-wool 2.5K (*) |
|---|---|---|
| 1 | 112.9 | 99.8 |
| 2 | 114.9 | 96.6 |
| 3 | 113.1 | 91.4 |
| 4 | 113.2 | 64.8 |
| 5 | 114.8 | 65.3 |
| 6 | 113.9 | 86.2 |

Referring to the results of Table 1 and Table 2, it can be confirmed that the window of the example has a reduced degree of reduction in the contact angle compared to the initial contact angle after the chemical resistance evaluation process compared to the window of the comparative example. In addition, referring to the results of Table 3 and Table 4, it can be confirmed that the window of the example has a reduced degree of reduction in the contact angle compared to the initial contact angle after the grinding resistance evaluation process compared to the window of the comparative example. From the results of Table 1 to Table 4, it can be confirmed that the window of the example has increased chemical resistance and grinding resistance by including a third layer interposed between a second layer and a fourth layer and including iron (Fe), which is a solvent-resistant metal.

Table 5 below shows the surface reflectance and the reflective color in each of the window of the example and the window of the comparative example. Table 5 shows the surface reflectance and the reflective color of a window having the stacked structure of the example and the surface reflectance and the reflective color of a window having the stacked structure of the comparative example, which are described in Table 1 to Table 4, wherein the reflective color is shown by measuring the color shift value of each of color coordinates a* and b* based on specular component excluded (SCE) reflection. Materials of layers included in each of the example and the comparative example were applied the same as described above in Table 1 to Table 4, and in the case of the example of Table 5, the surface reflectance and the reflective color of a window of three specifications having different thicknesses of a third layer including iron (Fe) were measured, and the thickness of each of other layers was applied the same as described above in Table 1 to Table 4.

TABLE 5

| Classification | Third layer thickness | Evaluation method | Surface reflectance | Reflective color (SCE) a* | b* |
|---|---|---|---|---|---|
| Comparative Example | — | Sample evaluation | 5.65% | −0.05 | −0.33 |
| Example Specification 1 | 2 nm | Simulation evaluation | 5.73% | −0.36 | −0.62 |
| | | Sample evaluation | 5.65% | −0.15 | −0.53 |
| Example Specification 2 | 10 nm | Simulation evaluation | 5.98% | −1.48 | −1.36 |
| | | Sample evaluation | 5.92% | −0.92 | −0.88 |
| Example Specification 3 | 12 nm | Simulation evaluation | 6.19% | −2.17 | −1.71 |
| | | Sample evaluation | 6.02% | −1.97 | −1.66 |

Referring to the result of Table 5, it can be confirmed that even though Example Specifications 1 and 2 include a third layer having a metal material, the surface reflectance thereof did not significantly increase compared to that of the comparative example not including a third layer, and has a value of about 6% or less, and it can be confirmed that no significant color shift occurred. As in the case of Example Specification 3, when a third layer is formed to a thickness of about 12 nm, which is a thickness in the range of greater than 10 nm, it can be confirmed that the window has a high surface reflectance value of greater than about 6% and also has a high color shift value in the reflective color evaluation. Through the result of Table 5, it can be expected that as the window of an embodiment includes a third layer having a thickness of about 10 nm or less, the chemical resistance and grinding resistance will be increased as described above, without significantly increasing the surface reflectance and without having reflective color defects.

Table 6 below shows the surface reflectance, and chemical resistance evaluation, and grinding resistance evaluation results of a window of an example other than the example described in Table 1 to Table 5. Table 6 shows the surface reflectance, and chemical resistance evaluation and grinding resistance evaluation results of an example in which a third layer is formed through Cu and Ni, respectively, rather than Fe, in a window having the stacked structure of the example described in Tables 1 to 5 described above. The chemical resistance evaluation and the griding resistance evaluation were applied the same as described in the description of Table 1 to Table 4. In addition, the thickness and material of each of remaining layers except for the third layer in the window of the example were applied the same as described in the description of Table 1 to Table 4, and the thickness of the third layer was set to 2 nm.

The fifth layer SML has excellent mechanical strength while having low refractive properties, and may include a material for increasing adhesion. In an embodiment, the fifth layer SML may include magnesium oxide (MgO). The fifth layer SML may further include silicon dioxide ($SiO_2$) in addition to the magnesium oxide. The fifth layer SML may include a solid solution including magnesium oxide in the structure. The fifth layer SML may include, for example, a solid solution in which magnesium oxide and silicon dioxide are mixed. As the fifth layer SML include a solid solution including magnesium oxide, the adhesion thereof to the first layer LRL which also includes magnesium oxide may be increased. Like the first layer LRL, the fifth layer SML may also be provided through an ion-assisted deposition process.

The fifth layer SML may have a thickness of, for example, about 5 nm to about 25 nm. When the thickness of the fifth layer SML is less than about 5 nm, an effect of increasing adhesion between the base layer BL and the first layer LRL might not be implemented. When the thickness of the fifth layer SML is greater than about 25 nm, the reflectance of the window WM-1 may increase, and the total thickness of the window WM-1 may increase, thereby excessively increasing the overall thickness of a display device.

At a wavelength of about 550 nm, the refractive index of the fifth layer SML may be about 1.3 to about 1.6. In the window WM-1 of an embodiment, at a wavelength of about 550 nm, the refractive index of the fifth layer SML may be about 1.45 to about 1.50. As the refractive index of the fifth layer SML satisfies the range at a wavelength of about 550 nm, the surface reflectance of the window WM-1 may be reduced.

TABLE 6

| Classification | Third layer material | Evaluation method | Surface reflectance | After chemical resistance 3K (°) | After steel-wool 3K (°) |
|---|---|---|---|---|---|
| Example a | Cu | Sample evaluation | 5.82% | 102.8 | 100.7 |
| Example b | Ni | Sample evaluation | 5.91% | 101.1 | 99.2 |

Referring to the results of Table 2, Table 4 and Table 6 together, it can be confirmed that as in each of Example a and Example b, even when a third layer is respectively formed through Cu and Ni, which are different types of solvent-resistant metals from Fe, the surface reflectance does not significantly increase, and a degree of reduction in the contact angle compared to the initial contact angle is reduced. For example, through the results of Table 1 to Table 4, and Table 6, it can be confirmed that the window of the example has increased chemical resistance and grinding resistance by including a third layer interposed between a second layer and a fourth layer and including copper (Cu), nickel (Ni), iron (Fe), or the like, which are solvent-resistant metals.

Referring to FIG. 4B, a window WM-1 of an embodiment may further include a fifth layer SML disposed between the base layer BL and the first layer LRL.

The fifth layer SML is disposed on the base layer BL, and may be a layer for increasing adhesion between the base layer BL and the first layer LRL. The fifth layer SML may be an adhesion promoter which has excellent adhesion with respect to each of the base layer BL and the first layer LRL, thereby increasing interlayer adhesion between the base layer BL and the first layer LRL. The fifth layer SML may be disposed directly on the base layer BL. The fifth layer SML may be in contact with the base layer BL and the first layer LRL.

Figure 4C:
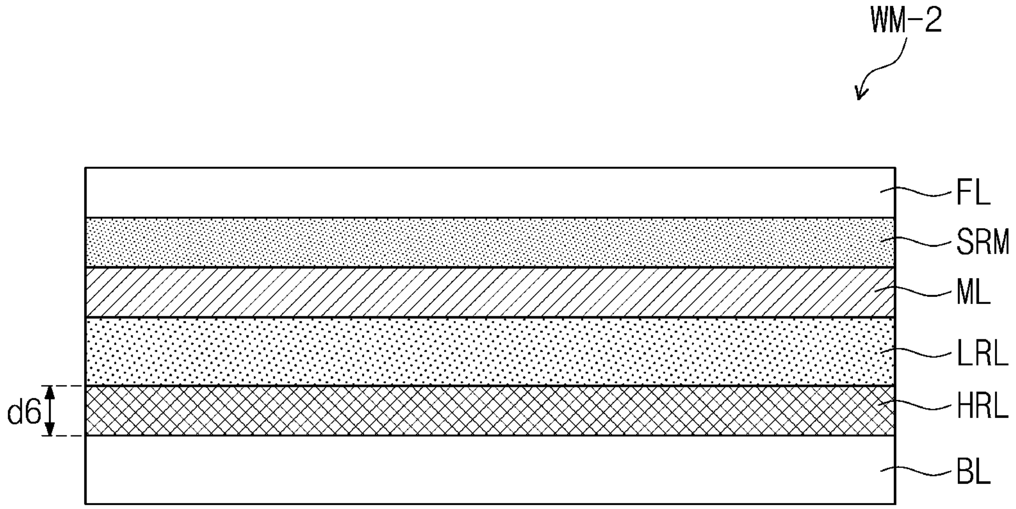

Referring to FIG. 4C, a window WM-2 of an embodiment may further include a sixth layer HRL disposed between the base layer BL and the first layer LRL. The sixth layer HRL may be a layer having a high refractive index compared to other layers. In the window WM-2 of an embodiment, at a wavelength of about 550 nm, the refractive index of the sixth layer HRL may be about 1.7 to about 3.0. At a wavelength of about 550 nm, the refractive index of the sixth layer HRL may be about 2.0 to about 2.5. At a wavelength of about 550 nm, the refractive index of the sixth layer HRL may be about 2.33.

The sixth layer HRL is disposed on the base layer BL, and has high refractive properties, and thus, may further reduce the surface reflectance of the window WM-2. Since the window WM-2 of an embodiment has a structure in which the first layer LRL, the second layer ML, and the fourth layer FL which have low refractive properties are sequentially stacked on the sixth layer HRL which has high refractive properties, the surface reflectance of the window WM-2 is reduced, and the sixth layer HRL has excellent adhesion to each of the base layer BL and the first layer LRL, so that the interlayer adhesion between the base layer BL and the first layer LRL may be maintained high. The sixth layer HRL may be disposed directly on the base layer BL. The sixth layer HRL may be in contact with the base layer BL and the first layer LRL.

The sixth layer HRL has excellent mechanical strength while having high refractive properties, and may include a material for increasing adhesion. In an embodiment, the sixth layer HRL may include zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), tungsten oxide ($WO_3$), and/or aluminum nitride (AlN). For example, the sixth layer HRL may include niobium oxide ($Nb_2O_5$). As the sixth layer HRL includes niobium oxide ($Nb_2O_5$) or the like, the sixth layer HRL has a high refractive index in the range described above, and may have excellent adhesion with respect to each of the base layer BL and the first layer LRL with which the sixth layer HRL is in contact. Like the first layer LRL, the sixth layer HRL may also be provided through an ion-assisted deposition process. In a process of providing the sixth layer HRL, a high refractive material such as zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), tungsten oxide ($WO_3$), aluminum nitride (AlN), or the like is deposited on a surface of the base layer BL in the form of particles, while an ionized oxygen ($O_2$) gas is provided together during a deposition process, so that the adhesion of a deposition film to the surface of the base layer BL may be increased.

The sixth layer HRL may have a thickness d6 of, for example, about 5 nm to about 25 nm. For example, the thickness d6 of the sixth layer HRL may be about 10 nm. When the thickness d6 of the sixth layer HRL is less than about 5 nm, the reflectance of the window WM-2 may increase, and an effect of increasing the adhesion between the base layer BL and the first layer LRL might not be implemented. When the thickness d6 of the sixth layer HRL is greater than about 25 nm, the total thickness of the window WM-2 may increase, thereby excessively increasing the overall thickness of a display device.

In the window WM-2 of an embodiment, at a wavelength of about 550 nm, the surface reflectance of the window WM-2 may be about 5.0% or less. The fourth layer FL is disposed on the uppermost layer of the window WM-2 of an embodiment, and at a wavelength of about 550 nm, the reflectance on an upper surface of the fourth layer FL may be about 5.0% or less. At a wavelength of about 550 nm, the reflectance on the upper surface of the fourth layer FL may be about 4.0% to about 4.5%. As the window WM-2 according to an embodiment of the inventive concept further includes the sixth layer HRL provided between the first layer LRL and the base layer BL, the surface reflectance may be further lowered compared to a case in which the first layer LRL is disposed directly on the base layer BL without the sixth layer HRL. For example, in the window WM-2 according to an embodiment, the sixth layer HRL having high refractive properties is provided between the base layer BL and the first layer LRL, so that the window may have a structure in which a high refractive layer and a low refractive layer are sequentially disposed on a base layer, through which a structure of further reducing the surface reflectance of the window WM-2 may be implemented. Since a material such as niobium oxide ($Nb_2O_5$) is deposited on the upper surface of the base layer BL through an ion-assisted deposition process, the sixth layer HRL included in the window WM-2 has high adhesion with respect to the base layer BL, and thus, may have the same level of wear resistance properties, chemical resistance properties, and grinding resistance properties compared to a window in which the sixth layer HRL is omitted. Accordingly, a display device including the window WM-2 may have excellent low reflective properties without degraded durability.

Figure 4D:
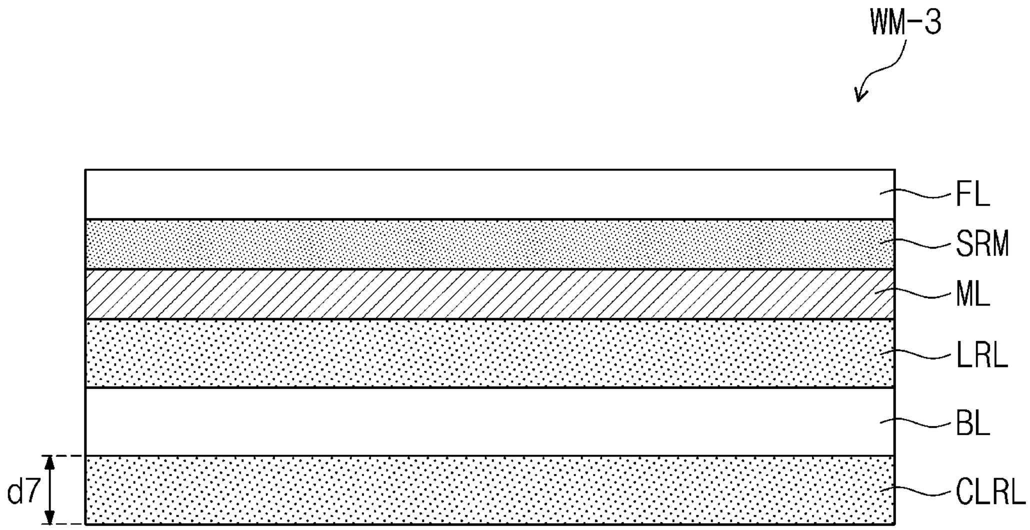

Referring to FIG. 4D, a window WM-3 of an embodiment may further include a seventh layer CLRL disposed below the base layer BL. The seventh layer CLRL may be a layer having a low refractive index. In the window WM-3 of an embodiment, at a wavelength of about 550 nm, the refractive index of the seventh layer CLRL may be about 1.3 to about 1.5. At a wavelength of about 550 nm, the refractive index of the seventh layer CLRL may be about 1.38 to about 1.40.

The seventh layer CLRL is disposed below the base layer BL, and may further reduce the surface reflectance of the window WM-3. In addition, as the window WM-3 of an embodiment further includes the seventh layer CLRL disposed below the base layer BL, the reflective color may be superior to that of a window not including the seventh layer CLRL. The seventh layer CLRL is disposed below the base layer BL, and may be spaced apart from the first layer LRL with the base layer BL interposed therebetween. For example, when the window WM-3 of an embodiment is applied to the display device DD (see FIG. 2), the seventh layer CLRL may be a layer adjacent to the display module DM (see FIG. 2) relative to the base layer BL, the first layer LRL, the second layer ML, and the fourth layer FL. The seventh layer CLRL may be disposed directly below the base layer BL. The seventh layer CLRL may be in contact with the lower surface of the base layer BL.

The seventh layer CLRL may include a material with a low refractive index, and with excellent adhesion to the base layer BL. The seventh layer CLRL may include a first material as in the case of the first layer LRL, and the first material may include a material having a lower refractive index than a material included in the base layer BL as described above. The first material included in the seventh layer CLRL may include silicon dioxide, fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO). For example, the seventh layer CLRL may include magnesium fluoride ($MgF_2$) and/or magnesium oxide (MgO) as the first material.

In an embodiment, the seventh layer CLRL may include magnesium oxide (MgO). The seventh layer CLRL may further include magnesium oxide ($MgF_2$) and yttrium oxyfluoride (YOF) in addition to the magnesium fluoride. The seventh layer CLRL may include a solid solution including magnesium oxide in the structure. The seventh layer CLRL may include, for example, a solid solution in which magnesium oxide, magnesium fluoride, and yttrium oxyfluoride are mixed. Alternatively, the seventh layer CLRL may include magnesium fluoride ($MgF_2$). The seventh layer CLRL may layer) may be a single layer composed magnesium fluoride ($MgF_2$).

The seventh layer CLRL may include the same material as that of the first layer LRL, or a different material therefrom. For example, the first layer LRL and the seventh layer CLRL may both include magnesium fluoride. Each of the first layer LRL and the seventh layer CLRL may include a solid solution in which magnesium oxide, magnesium fluoride, and yttrium oxyfluoride are mixed. Alternatively, one of the first layer LRL and the seventh layer CLRL may include magnesium fluoride, and the other thereof may include a solid solution in which magnesium oxide, magnesium fluoride, and yttrium oxyfluoride are mixed.

Like the first layer LRL, the seventh layer CLRL may also be provided through an ion-assisted deposition process. In a process of providing the seventh layer CLRL, at least one of materials such as magnesium oxide, magnesium fluoride, yttrium oxyfluoride, and the like is deposited on a surface of the base layer BL in the form of particles, while an ionized argon (Ar) gas or oxygen ($O_2$) gas is provided together during a deposition process, so that the adhesion of a deposition film to the surface of the base layer BL may be increased.

The seventh layer CLRL may have a thickness d7 of, for example, about 50 nm to about 130 nm. When the thickness d7 of the seventh layer CLRL is less than about 50 nm, the surface reflectance of the window WM-3 might not be sufficiently reduced. When the thickness d7 of the seventh layer CLRL is greater than about 130 nm, the mechanical strength of the window WM-3 may be reduced, thereby reducing durability, and the total thickness of the window WM-3 may increase, thereby excessively increasing the overall thickness of a display device.

In the window WM-3 of an embodiment, at a wavelength of about 550 nm, the surface reflectance of the window WM-3 may be about 5.0% or less. The fourth layer FL is disposed on the uppermost layer of the window WM-3 of an embodiment, and at a wavelength of about 550 nm, the reflectance on an upper surface of the fourth layer FL may be about 5.0% or less. At a wavelength of about 550 nm, the reflectance on the upper surface of the fourth layer FL may be about 4.0% to about 4.5%. As the window WM-3 according to an embodiment of the inventive concept further includes the seventh layer CLRL provided below the base layer BL, the surface reflectance may be further lowered compared to a case in which there is no separate layer disposed below the base layer BL. For example, the window WM-3, according to an embodiment, may have a structure in which the first layer LRL and the seventh layer CLRL which have low refractive properties may be provided on each of both sides of the base layer BL, through which a structure of further reducing the surface reflectance of the window WM-3 may be implemented. Accordingly, a display device including the window WM-3 may have excellent low reflective properties.

According to an embodiment of the inventive concept, a window includes a plurality of layers disposed on a base layer and including a specific material, and thus, may have excellent adhesion between the layers while having low refractive properties, and may have increased mechanical strength, such as wear resistance, chemical resistance, and grinding resistance. Accordingly, the durability and reliability of a display device including the window may be increased.

Although the inventive concept has been described with reference to various embodiments of the inventive concept, it will be understood by those skilled in the art that various changes in form and details may be made therein without departing from the spirit and scope of the inventive concept as set forth herein.

What is claimed is:

1. A window, comprising:

a base layer;

a first layer disposed on the base layer;

a second layer disposed on the first layer;

a third layer disposed on the second layer; and a fourth layer disposed on the third layer, wherein the second layer includes silicon dioxide ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO), and wherein the third layer includes iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti).

2. The window of claim 1, wherein the thickness of the third layer is within a range of from 2 nm to 10 nm.

3. The window of claim 1, wherein at a wavelength of 550 nm, the refractive index of the second layer is within a range of from 1.3 to 1.6.

4. The window of claim 1, wherein the second layer comprises silicon dioxide ($SiO_2$), magnesium oxide (MgO), and/or aluminum oxide ($Al_2O_3$).

5. The window of claim 1, wherein:

the second layer is disposed directly on the first layer;

the third layer is disposed directly on the second layer; and the fourth layer is disposed directly on the third layer.

6. The window of claim 1, wherein the first layer comprises magnesium fluoride ($MgF_2$) and/or magnesium oxide (MgO).

7. The window of claim 6, wherein the first layer further comprises yttrium oxyfluoride (YOF).

8. The window of claim 7, wherein the first layer comprises a solid solution in which the magnesium oxide, the magnesium fluoride, and the yttrium oxyfluoride are mixed.

9. The window of claim 1, wherein at a wavelength of 550 nm, reflectance on an upper surface of the fourth layer is 6.0% or less.

10. The window of claim 1, wherein the fourth layer comprises a fluorine-containing polymer.

11. The window of claim 1, wherein:

at a wavelength of 550 nm, a refractive index of the first layer is within a range of from 1.3 to about 1.5; and at a wavelength of 550 nm, a refractive index of the fourth layer is within a range of from 1.3 to about 1.5.

12. The window of claim 1, wherein the base layer comprises a glass substrate or a polymer film.

13. The window of claim 1, wherein:

a thickness of the first layer is within a range of from 50 nm to 90 nm;

a thickness of the second layer is within a range from 10 nm to 25 nm; and a thickness of the fourth layer is with a range of from 20 nm to 45 nm.

14. The window of claim 1, further comprising a fifth layer disposed between the base layer and the first layer, and including magnesium oxide.

15. The window of claim 1, further comprising a sixth layer disposed between the base layer and the first layer, and including zirconium oxide ($ZrO_2$), hafnium oxide ($HfO_2$), tantalum oxide ($Ta_2O_5$), niobium oxide ($Nb_2O_5$), titanium oxide ($TiO_2$), ytterbium oxide ($Y_2O_3$), silicon nitride ($Si_3N_4$), strontium titanate ($SrTiO_3$), tungsten oxide ($WO_3$), and/or aluminum nitride (AlN).

16. The window of claim 1, further comprising a seventh layer disposed below the base layer, and including magnesium oxide, magnesium fluoride, and/or yttrium oxyfluoride.

17. A display device, comprising:

a display module; and a window disposed on the display module, wherein the window includes:

a base layer;

a first layer disposed on the base layer;

a second layer disposed on the first layer;

a third layer disposed on the second layer; and a fourth layer disposed on the third layer, wherein the second layer includes silicon dioxide ($SiO_2$), fused silica, fluorine-doped fused silica, magnesium fluoride ($MgF_2$), calcium fluoride ($CaF_2$), aluminum fluoride ($AlF_3$), yttrium fluoride ($YF_3$), ytterbium fluoride ($YbF_3$), aluminum oxide ($Al_2O_3$), and/or magnesium oxide (MgO), and wherein the third layer includes iron (Fe), copper (Cu), nickel (Ni), zirconium (Zr), hafnium (Hf), aluminum (Al), silver (Ag), gold (Au), chromium (Cr), tin (Sn), zinc (Zn), indium (In), and/or titanium (Ti).

18. The display device of claim 17, wherein the display module comprises:

a base substrate;

a circuit layer disposed on the base substrate;

a light emitting element layer disposed on the circuit layer; and an anti-reflection layer disposed on the light emitting element layer, wherein the anti-reflection layer includes a partition layer in which a plurality of light emitting elements and a plurality of partition openings respectively overlapping the plurality of light emitting elements are defined, and wherein a plurality of color filters are respectively disposed corresponding to the plurality of partition openings.

19. The display device of claim 17, wherein the first layer is spaced apart from the display module with the base layer interposed therebetween.

20. The display device of claim 17, wherein an upper surface of the fourth layer defines an outermost surface of the window.

* * * * *